United States Patent
Klebanoff et al.

(10) Patent No.: US 7,473,301 B2
(45) Date of Patent: Jan. 6, 2009

(54) ADHESIVE PARTICLE SHIELDING

(75) Inventors: Leonard Elliott Klebanoff, Dublin, CA (US); Daniel John Rader, Albuquerque, NM (US); Christopher Walton, Berkeley, CA (US); James Folta, Livermore, CA (US)

(73) Assignee: EUV LLC, Santa Clara, CA (US)

( * ) Notice: Subject to any disclaimer, the term of this patent is extended or adjusted under 35 U.S.C. 154(b) by 1591 days.

(21) Appl. No.: 10/245,218

(22) Filed: Sep. 17, 2002

(65) Prior Publication Data

US 2004/0050317 A1 Mar. 18, 2004

(51) Int. Cl.
*B01D 45/08* (2006.01)

(52) U.S. Cl. ............... 95/285; 55/465; 55/524; 55/DIG. 14

(58) Field of Classification Search ............... 95/285; 55/524, DIG. 14, 436, 462, 465; 73/28.05, 73/863.22
See application file for complete search history.

(56) References Cited

U.S. PATENT DOCUMENTS

| | | | |
|---|---|---|---|
| 4,182,673 A * | 1/1980 | Schmidt et al. ............... 209/45 |
| 4,327,243 A | 4/1982 | Hopkins et al. |
| 4,330,682 A * | 5/1982 | Dale et al. ............... 174/14 R |
| 4,697,701 A * | 10/1987 | Ying ............... 206/316.1 |
| 4,761,335 A | 8/1988 | Aurichio et al. |
| 4,972,957 A * | 11/1990 | Liu et al. ............... 209/143 |
| 5,087,494 A | 2/1992 | Calhoun et al. |
| 5,168,993 A * | 12/1992 | Yen ............... 206/316.1 |
| 5,246,771 A | 9/1993 | Kawaguchi |
| 5,304,419 A | 4/1994 | Shores |
| 5,314,728 A | 5/1994 | Yen |
| 5,476,520 A | 12/1995 | Jaffe et al. |
| 5,670,226 A | 9/1997 | Yoshizawa et al. |
| 5,691,088 A * | 11/1997 | Kubota et al. ............... 430/5 |
| 5,693,895 A * | 12/1997 | Baxter ............... 73/863.22 |
| 5,716,727 A | 2/1998 | Savinell et al. |
| 5,719,705 A | 2/1998 | Machol |
| 5,811,184 A * | 9/1998 | Anderson et al. ............... 428/343 |
| 5,885,711 A | 3/1999 | Clarisse et al. |
| 5,993,696 A | 11/1999 | Hanhi et al. |
| 6,072,157 A | 6/2000 | Klebanoff et al. |
| 6,099,988 A | 8/2000 | Savinell et al. |
| 6,153,044 A | 11/2000 | Klebanoff et al. |
| 6,190,743 B1 * | 2/2001 | Wang ............... 428/14 |
| 6,253,464 B1 | 7/2001 | Klebanoff et al. |
| 6,255,450 B1 | 7/2001 | Angelopoulos et al. |
| 6,463,814 B1 * | 10/2002 | Letarte et al. ............... 73/863.22 |
| 6,635,390 B1 * | 10/2003 | Badger et al. ............... 430/5 |

(Continued)

*Primary Examiner*—Duane Smith
*Assistant Examiner*—Robert A Clemente
(74) *Attorney, Agent, or Firm*—Cascio Schmoyer & Zervas

(57) ABSTRACT

An efficient device for capturing fast moving particles has an adhesive particle shield that includes (i) a mounting panel and (ii) a film that is attached to the mounting panel wherein the outer surface of the film has an adhesive coating disposed thereon to capture particles contacting the outer surface. The shield can be employed to maintain a substantially particle free environment such as in photolithographic systems having critical surfaces, such as wafers, masks, and optics and in the tools used to make these components, that are sensitive to particle contamination. The shield can be portable to be positioned in hard-to-reach areas of a photolithography machine. The adhesive particle shield can incorporate cooling means to attract particles via the thermophoresis effect.

23 Claims, 1 Drawing Sheet

U.S. PATENT DOCUMENTS

| | | | |
|---|---|---|---|
| 6,654,201 B2 * | 11/2003 | Smith | 360/97.02 |
| 6,665,150 B2 * | 12/2003 | Smith | 360/265.7 |
| 6,692,553 B2 * | 2/2004 | Jordan et al. | 95/285 |
| 7,125,437 B2 * | 10/2006 | Bryden et al. | 95/29 |
| 7,135,060 B2 * | 11/2006 | Jordan et al. | 96/413 |
| 7,141,095 B2 * | 11/2006 | Aitchison et al. | 95/273 |
| 2003/0067704 A1 * | 4/2003 | Woo et al. | 360/69 |
| 2007/0117383 A1 * | 5/2007 | Aitchison et al. | 438/680 |
| 2007/0139745 A1 * | 6/2007 | Shoji et al. | 359/204 |

* cited by examiner

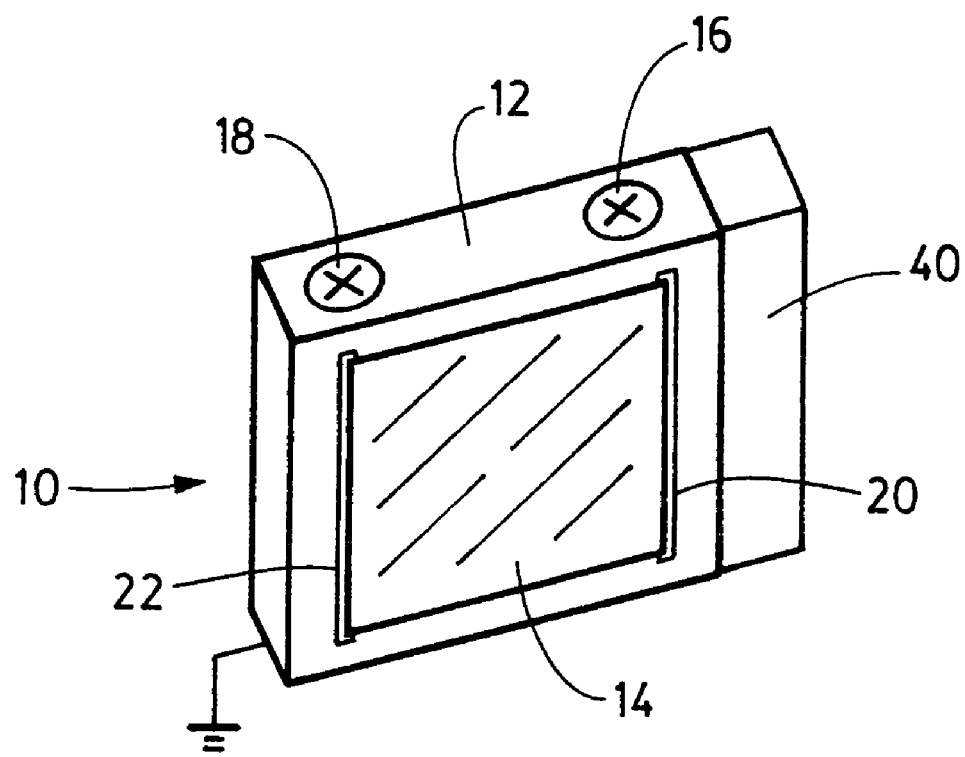
FIG._1.
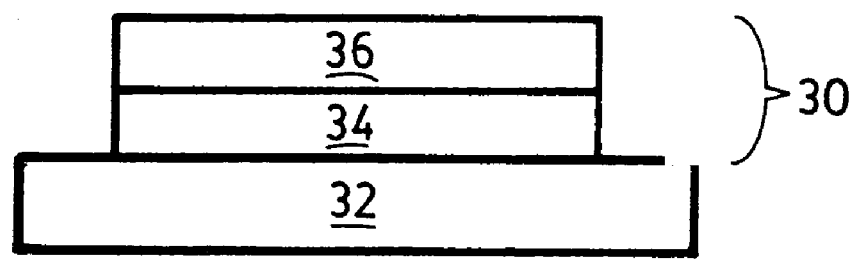
FIG._2.

000
ADHESIVE PARTICLE SHIELDING

This invention was made with Government support under Contract No. DE-AC04-94AL85000 awarded by the U.S. Department of Energy to Sandia Corporation. The Government has certain rights to the invention.

FIELD OF THE INVENTION

This invention relates generally to an apparatus for preventing surface contamination by intercepting and capturing particulate matter and particularly for preventing deposition of particulate matter onto lithographic components such as reticles (masks), wafers, and other critical components during lithographic use, fabrication, inspection, repair, handling, and storage.

BACKGROUND OF THE INVENTION

The ability to produce high quality microelectronic devices and reduce yield losses is strongly dependent upon maintaining the surfaces substantially defect-free. This is particularly true as design rules drive integrated circuits to finer feature size. Generally, surface defects can be related to particulate matter being deposited onto surfaces of reticles (masks) and wafer substrates during the various operations required to produce integrated circuits. The need to maintain these surfaces substantially free of particulate matter has long been recognized in the microelectronics industry and various schemes to do so have been proposed, such as those set forth in U.S. Pat. Nos. 5,373,806 and 5,472,550. The former discloses the use of thermal energy, such as the use of radiant energy, RF, or resistance heating, to substantially eliminate electrostatic attraction as a mechanism for particle transport and deposition during gas phase processing while the latter describes the use of the photophoretic effect to capture particles by projecting a laser beam inside the processing chamber along a trajectory that does not contact the substrate surface.

The concern about printable defects caused by particle deposition onto surfaces is of particular importance for the next generation of lithographies, including proximity x-ray lithography, direct-write and projection electron-beam lithography (SCALPEL), direct-write and projection ion-beam lithography, and extreme ultraviolet (radiation having a wavelength in the region of 3.5-15 nm) lithography (EUVL) which must provide for exclusion of particles with diameters greater than 0.01 µm.

Because of the importance of protecting lithographic surfaces, such as reticles, from deposition of particulate matter for next generation lithographies alternative protection schemes such as clean encapsulation of the exposure chamber, protective gas blankets, and in situ cleaning of mask surfaces are being investigated. However, each of these alternative schemes has disadvantages and none has been developed to the point of application.

What is needed is a means to protect lithographic surfaces, such as those of the reticle and wafer, from particle deposition without comprising lithographic performance or contaminating lithographic optical elements. Moreover, in order to be useful in advanced lithographic applications it is necessary that the protecting means operate effectively in a sub-atmospheric pressure environment.

SUMMARY OF THE INVENTION

The present invention is based in part on the recognition that strategically positioning an adhesive particle shield can significantly reduce and/or essentially eliminate contaminants typically generated in vacuum systems. The invention is particularly suited for photolithographic systems having critical surfaces, such as wafers, masks, and optics, that are sensitive particle contamination. The inventive shield can also be employed in thin film depositions, e.g., sputter or CVD, that are used to coat these critical surfaces. The shield can be designed as a portable unit to be positioned in hard-to-reach areas of a photolithography machine.

In one embodiment, the invention is directed to an adhesive particle shield that includes:

a mounting panel; and a film that is attached to the mounting panel wherein the outer surface of the film has an adhesive coating disposed thereon to capture particles contacting the outer surface.

In another embodiment, the invention is directed to a method of maintaining a substantially particle free environment that includes the step of positioning a particle shield containing an adhesive coating that is capable of capturing free traveling particles and thereby removing the particles from the environment.

In yet another embodiment, the adhesive particle shield can incorporate cooling means to attract particles via the thermophoresis effect.

BRIEF DESCRIPTION OF THE DRAWINGS

FIG. 1 is a perspective view of the adhesive particle shielding apparatus; and

FIG. 2 is a cross-sectional view of an adhesive film for the apparatus.

DESCRIPTION OF PREFERRED EMBODIMENTS

FIG. 1 illustrates one embodiment of the adhesive particle shield 10 which includes mounting panel 12 supporting adhesive film 14. The configuration and dimensions of the mounting panel are not critical, however, in one preferred embodiment, the mounting panel is sized so that it can be manually handled and maneuvered into extreme ultraviolet lithography systems such as that described in Tichenor et al. "Extreme Ultraviolet Lithography Machine" U.S. Pat. No. 6,031,598 which is incorporated herein. The mounting panel can be made of any vacuum compatible material which does not release, i.e., outgas, vapors in subatmospheric pressures. Preferred materials include, for example, stainless steel, and ceramics. For a variety of reasons including safety requirements, the mounting panel can be electrically grounded.

The adhesive film 14 can be attached to one or more sides of the mounting panel by conventional means. As further descried herein, the adhesive film typically comprises a support web or tape with a layer of adhesive material coated thereon. The adhesive film can be clamped, tacked, or stapled, to the side(s) of the mounting panel. When the adhesive layer becomes coated with contaminants, the old strip of adhesive film can be removed, and new strip installed. Alternatively, multiple layers of adhesive films, assembled on top of each other, can also be employed so that the tape also functions as a release liner. This allows one saturated adhesive film to be pulled away and discarded leaving exposed a fresh (uncontaminated) adhesive film.

In another embodiment, the adhesive film can be fabricated as a long web that is wound about a roll or spindle which in turn can be packaged in a cartridge. As shown in FIG. 1, the cartridge 16 is inserted into one end of mounting panel 12 with the exposed edge of adhesive film being secured to another roll 18 positioned at the other end of mounting panel 12. In this fashion, the surface of adhesive film 14, which fits through vertical slots 20, 22 on the mounting panel, faces away from mounting panel 12 and is ready for use. When the surface of adhesive film 14 has trapped sufficient particles, then a fresh surface of adhesive film can be introduced by winding the used adhesive film into roll 18.

For use in vacuum systems, the adhesive film is preferably made of materials that are low-outgassing and thermally stable. A preferred adhesive film is a polyimide pressure sensitive tape coated with a fully cured silicone adhesive that is available as AIRKAP 1 from Airtech International, Inc. (Huntington, Calif.). The silicone adhesive has a thickness of about 0.0015 in. (37 µm.) and produces undetectable outgassing at pressures above about $10^{-11}$ Torr. The tape can also be baked-out for ultra high vacuum applications.

By "undetectable outgassing" or "no outgassing" is meant that a material releases essentially no or only negligible amounts of gaseous materials having a molecular weight of 44 atomic mass units or higher when the material is in a subatmospheric environment with a pressure of about $10^{-11}$ Torr or lower.

When a particle strikes the surface of the adhesive film, it will stick to and be trapped by the adhesive material. With the inventive adhesive particle shield, fast moving particles with velocity greater than about 5 m/s, for example, will stick to the adhesive material. Such particles will usually just bounce off conventional, e.g., metal, shielding, and contaminate critical surfaces. As a corollary, the thickness and/or type of adhesive material used is preferably selected to accomplish this in light of the types, e.g. material and size, of particles and their velocities that are expected to be encountered. Typical particle contaminants include, for example, hydrocarbons, oxides, and metals and they usually range from 10 nm to 100 µm in diameter and can travel at speeds of from 0 to 100 m/s or higher. The particles can be generated in photolithography systems, in deposition chambers during sputtering, chemical vapor deposition, and other coating processes, and other environments where the inventive shield is employed. Coating devices are well known in the art and are available, for example, from Applied Materials, Inc. (Santa Clara, Calif.) and Lam Research Corporation (Fremont, Calif.). Regardless of the environment where the inventive shield is employed, the effect will be that fewer particle contaminants will be present in the process. In the case of photolithography systems, this will result in reduced defect levels in the wafers produced.

Another feature of the invention is that the adhesive layer and/or web portion of the adhesive film can be modified to improve performance of the adhesive shielding panel. FIG. 2 illustrates an adhesive film 30 that is attached to the surface of mounting panel 32. The adhesive film includes web or tape 34 and adhesive layer 36. In some applications it can be desirable to use web or tape that is electrically conducting and/or is a good thermal conductor. Similarly, the adhesive material itself could be electrically conducting.

Electrically conductive tapes, for example, can be made from electrically conductive polymers which include (i) filled electrically conductive plastics, which are composed of thermoplastics or thermosets containing electrically conductive fillers like carbon black or soot, carbon fibers, and metal powder, and (ii) inherently electrically conductive plastics, which are based on polymers that are made electrically conductive by oxidation or reduction (doping).

Inherently conductive polymers and copolymers are known compounds, and among these polymers and copolymers there may be mentioned poly(thiophenes), polypyrroles, polyacetylenes, polyphenylenes, polythiophene-polypyrrole copolymers, and derivatives thereof. These inherently conductive polymers are generally doped with strong oxidizing compounds. Dopants include arsenic pentafluoride, ferric chloride, nitrosyl tetrafluoroborate, nitrosyl hexafluorophosphate, auric chloride, and ferric tosylate. Electrically conductive polymers are further described in U.S. Pat. Nos. 5,198,153, 5,885,711, 5,993,696, and 6,255,450 which are incorporated herein.

Adhesive materials preferably are made of commercially available pressure sensitive adhesives which include, for example, silicones, acrylics, vinyl ether polymers, polyurethanes, and polychloroprene. These adhesives may contain various additives, such as tackifiers, plasticizers, fillers, stabilizers, colorants and other additives. The adhesive material can be made electrically conductive by dispersing electrically conductive particles therein. The particles can be selected from any suitable material including, for example, iron, copper, aluminum, nickel, and alloys thereof. Some of the adhesives such as silicones may be inappropriate where outgassing is a concern as in photolithography processes. However, these same adhesives may be acceptable if outgassing is not a problem such as in most coating processes and/or other processes that are carried out in non-vacuum environments.

Finally, it may be desirable to cool the mounting panel in order to exploit the thermophoresis effect to attract particles to the adhesive layer. As shown in FIG. 1, the adhesive shielding panel 10 includes a cooling device 40 which can consist of any conventional cooling means. A suitable technique circulates a coolant, e.g, water or glycol, to dissipate heat from the mounting panel. Another technique is to employ an electric fan which is particularly suited in non-vacuum environments. Thermophoresis can be a useful tool to promote particle deposition onto surfaces. Thermophoretic forces operate to cause particles to be driven from regions of higher gas temperature to regions of lower gas temperature. Thus by maintaining the mounting panel and specifically the adhesive layer at temperatures lower than their gaseous surroundings, particles are caused to migrate toward the cooler surfaces.

The thermophoretic effect is further described in Klebanoff & Rader "Thermophoretic Vacuum Wand" U.S. Pat. No. 6,072,157 and Klebanoff & Rader "Method for Protection of Lithographic Components From Particle Contamination" U.S. Pat. No. 6,253,464, both of which are incorporated herein by reference.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of maintaining a substantially particle free environment which comprises positioning a particle shield containing an adhesive coating that is capable of capturing free traveling particles and thereby removing the particles from the environment wherein the particle shield comprises: a mounting panel; and a film that is attached to the mounting panel wherein the outer surface of the film has an adhesive coating disposed thereon to intercept the free traveling particles and wherein the film comprises alternating release liner layers and adhesive layers.

2. The method of claim 1 further comprising the step of cooling the film.

3. The method of claim 1 wherein the particles comprise a material that is selected from the group consisting of hydrocarbons, oxides, metals, and mixtures thereof.

4. The method of claim 1 wherein the free traveling particles move at a velocity of between 0 m/s to 100 m/s.

5. A method of maintaining a substantially particle free environment which comprises positioning a particle shield containing an adhesive coating that is capable of capturing free traveling particles and thereby removing the particles from the environment wherein the particle shield comprises: a mounting panel; and a film that is attached to the mounting panel wherein the outer surface of the film has an adhesive coating disposed thereon to intercept the free traveling particles and wherein the film comprises a web of liner material with an adhesive material coated on a surface of the web and wherein the film is wound as a roll with a portion of the adhesive material exposed.

6. The method of claim 5 further comprising the step of cooling the film.

7. The method of claim 5 wherein the particles comprise a material that is selected from the group consisting of hydrocarbons, oxides, metals, and mixtures thereof.

8. The method of claim 5 wherein the free traveling particles move at a velocity of between 0 m/s to 100 m/s.

9. A method of maintaining a substantially particle free environment which comprises positioning a particle shield containing an adhesive coating that is capable of capturing free traveling particles and thereby removing the particles from the environment wherein the particle shield comprises: a mounting panel; and a film that is attached to the mounting panel wherein the outer surface of the film has an adhesive coating disposed thereon to intercept the free traveling particles and wherein the film comprises a liner layer and an adhesive layer coated on the liner layer wherein both the liner and adhesive layers are electrically conductive.

10. The method of claim 9 wherein the panel is electrically grounded.

11. The method of claim 9 further comprising the step of cooling the film.

12. The method of claim 9 wherein the particles comprise a material that is selected from the group consisting of hydrocarbons, oxides, metals, and mixtures thereof.

13. The method of claim 9 wherein the free traveling particles move at a velocity of between 0 m/s to 100 m/s.

14. A method of maintaining a substantially particle free, environment which comprises positioning a particle shield containing an adhesive coating that is capable of intercepting free traveling particles and thereby removing the particles from the environment wherein the particle shield comprises: a mounting panel; and a film that is attached to the mounting panel wherein the outer surface of the film has an adhesive coating disposed thereon to intercept the free traveling particles and wherein the film comprises alternating release liner layers and adhesive layers.

15. The method of claim 14 wherein the particle shield is positioned in a vacuum environment within a photolithography system.

16. The method of claim 14 wherein the particle shield is positioned in a coating device.

17. A method of maintaining a substantially particle free, environment which comprises positioning a particle shield containing an adhesive coating that is capable of intercepting free traveling particles and thereby removing the particles from the environment wherein the particle shield comprises: a mounting panel; and a film that is attached to the mounting panel wherein the outer surface of the film has an adhesive coating disposed thereon to intercept the free traveling particles and wherein the film comprises a web of liner material with an adhesive material coated on a surface of the web and wherein the film is wound as a roll with a portion of the adhesive material exposed.

18. The method of claim 17 wherein the particle shield is positioned in a vacuum environment within a photolithography system.

19. The method of claim 17 wherein the particle shield is positioned in a coating device.

20. A method of maintaining a substantially particle free, environment which comprises positioning a particle shield containing an adhesive coating that is capable of intercepting free traveling particles and thereby removing the particles from the environment wherein the particle shield comprises: a mounting panel; and a film that is attached to the mounting panel wherein the outer surface of the film has an adhesive coating disposed thereon to intercept the free traveling particles and wherein the film comprises a liner layer and an adhesive layer coated on the liner layer wherein both the liner and adhesive layers are electrically conductive.

21. The method of claim 20 wherein the panel is electrically grounded.

22. The method of claim 20 wherein the particle shield is positioned in a vacuum environment within a photolithography system.

23. The method of claim 20 wherein the particle shield is positioned in a coating device.

* * * * *